US006806805B2

(12) United States Patent
Ahn et al.

(10) Patent No.: US 6,806,805 B2
(45) Date of Patent: Oct. 19, 2004

(54) LOW LOSS HIGH Q INDUCTOR

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/687,593

(22) Filed: Oct. 20, 2003

(65) Prior Publication Data

US 2004/0084750 A1 May 6, 2004

Related U.S. Application Data

(60) Continuation of application No. 09/982,959, filed on Oct. 22, 2001, now Pat. No. 6,656,813, which is a division of application No. 09/630,549, filed on Aug. 1, 2000, now Pat. No. 6,535,101.

(51) Int. Cl.[7] ............................................. H01L 29/772
(52) U.S. Cl. .................. 336/232; 336/84; 336/199; 336/223; 257/E21.022; 257/212; 257/213; 257/224; 257/244; 257/270; 257/302; 257/328; 257/332
(58) Field of Search .................. 257/212, 213, 257/224, 244, 270, 287, 133, 220, 242, 263, 302, 328, 330, 332, E21.022; 336/84, 184, 199, 223, 232

(56) References Cited

U.S. PATENT DOCUMENTS

| 4,795,605 A | 1/1989 | Fukunaga et al. |
| 4,859,633 A | 8/1989 | Bayraktaroglu |
| 5,070,317 A | 12/1991 | Bhagat |
| 5,227,659 A | 7/1993 | Hubbard |
| 5,497,337 A | 3/1996 | Ponnapalli et al. |
| 5,635,892 A | 6/1997 | Ashby et al. |
| 5,639,686 A | 6/1997 | Hirano et al. |
| 5,886,394 A | 3/1999 | Leeuwenburgh |
| 5,959,522 A | 9/1999 | Andrews |
| 6,008,102 A | 12/1999 | Alford et al. |
| 6,026,286 A | 2/2000 | Long |
| 6,054,329 A | 4/2000 | Burghartz et al. |
| 6,201,287 B1 | 3/2001 | Forbes |
| 6,221,727 B1 * | 4/2001 | Chan et al. .................. 438/381 |
| 6,303,971 B1 * | 10/2001 | Rhee .......................... 257/531 |
| 6,356,183 B1 * | 3/2002 | Jou ............................. 336/200 |

* cited by examiner

Primary Examiner—George Fourson
Assistant Examiner—Joannie Adelle Garcia
(74) Attorney, Agent, or Firm—Dickstein Shapiro Morin & Oshinsky LLP

(57) ABSTRACT

A high Q inductive element with low losses, high inductance and high efficiency is disclosed. The high Q inductive element with one or more inductive loops is formed over a silicon micro structure with thin support elements formed by deep plasma etching in bulk silicon. The support elements, which may have different configurations, such as walls or columns, provide mechanical stability to the inductive loops and reduce the parasitic capacitance and the losses to the substrate.

29 Claims, 9 Drawing Sheets

LOW LOSS HIGH Q INDUCTOR

CROSS-REFERENCE TO RELATED APPLICATION

The present application is a continuation application of U.S. patent application Ser. No. 09/982,959, filed on Oct. 22, 2001, now U.S. Pat. No. 6,656,813 which is a divisional of Ser. No. 09/630,549, filed Aug. 1, 2000 (now U.S. Pat. No. 6,535,101), the disclosures of both of which are incorporated by reference herein.

FIELD OF THE INVENTION

The present invention relates to the fabrication of semiconductor circuits and, in particular, to the fabrication of inductive elements with high quality factors (Q).

BACKGROUND OF THE INVENTION

As the need for miniaturization of electronic circuits continues to increase, many digital and analog circuits, such as operational amplifiers and microprocessors, are successfully implemented in silicon-based integrated circuits (IC). These circuits typically include various types of diodes, active devices, such as field effect transistors (FET), and passive devices, such as resistors, capacitors and inductors.

Radio frequency (RF) circuits remain, however, a challenge to minituarization of electronic circuits. One of the obstacles posed by advanced RF circuits, which include cellular phones and wireless modem circuits, is the difficulty in fabricating a good inductor in silicon technologies which is suitable for RF applications. Currently, implementing high quality factor (Q) inductors that operate at high RF remains problematic to very large scale integration (VLSI) IC semiconductor chips. Attempts to integrate high Q inductors into the silicon technologies have typically yielded inductor Q values of less than five, mainly because silicon substrates, as opposed to gallium arsenide substrates, are conductive and, thus, they induce losses. Another problem is that high inductance values (L), which are a requirement for high RF circuits, necessitate a large silicon chip area. This requirement prevents miniaturization of such circuits. Further, physically voluminous RF circuits cannot operate at high frequencies, where the short wavelengths demand physically small components. Currently, there is a growing demand for increased efficiency, since high frequency operations are highly desirable for induction elements, since they permit a decrease in the size of the device while affording the same reactance.

Since Q is directly proportional to the inductance (L) and the resonant angular frequency of oscillation ($\omega$), and inversely proportional to the series loss of the inductor or the resistance (R), high Q designs strive to increase the inductance and decrease the resistance, while keeping parasitic capacitance to a minimum so that high oscillation frequencies can be achieved. Several techniques have been developed in the semiconductor industry but with limited results. For example, a known technique employs wide metal lines. Unfortunately, because both the inductor area and the parasitic capacitance are increased, the oscillation frequency decreases and, thus, the useful frequency range is limited.

Accordingly, there is a need for further downsizing of induction elements, such as inductive loops on ICs, operating at high RF frequencies with low losses and high efficiency. There is a need in the art for a high Q inductor that will only slightly influence other components of the circuit, that has a sufficiently high current capacity and high inductance, and that occupies a minimal substrate area. In addition, there is a need in the art for a process for fabricating such an inductor.

SUMMARY OF THE INVENTION

The present invention provides a method for fabricating a high Q inductor element. The present invention employs a micro-electro-mechanical-system (MEMS) structure, in the form of a silicon micro-fan structure, formed by deep etching of silicon with high aspect ratio and high precision etch profile control. A plurality of high Q inductors for RF circuit applications are formed over thin silicon walls of such MEMS structure. The silicon walls, which can be any support elements for the high Q inductors, provide mechanical stability to the inductor loops as well as low losses and reduced parasitic capacitance.

Additional advantages of the present invention will be apparent from the following detailed description, of the invention, which is provided in conjunction with the accompanying drawings.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The term "substrate" used in the following description may include any semiconductor-based structure that has an exposed surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal"0 is intended to include not only elemental metal, but metal with other trace metals or in various alloyed combinations with other metals as known in the semiconductor art, as long as such alloy retains the physical and chemical properties of the metal. The term "metal" is also intended to include oxides of such metals.

The present invention provides a method for fabricating a low loss high Q inductor element compatible with a silicon substrate, which has minimal parasitic capacitance as well as low dispersion characteristics at high RF frequencies. In a preferred embodiment of the invention, a silicon micro-fan structure is provided with thin silicon walls on which inductive loops are formed.

Figure 1:
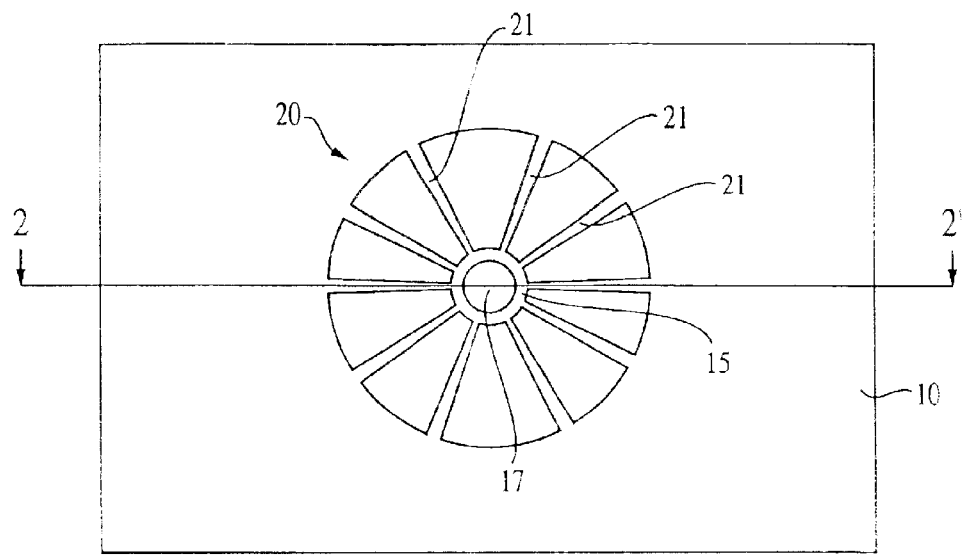
FIG. 1 is a top view of a micro-fan structure formed in accordance with the present invention.

Referring now to the drawings, where like elements are designated by like reference numerals, FIGS. 1–14 illustrate exemplary embodiments of a high Q inductor element 100 constructed in accordance with the present invention. FIG. 1 illustrates the formation of a micro-fan like structure 20 in a cavity 11 (not shown) of a bulk silicon substrate 10, on which the high Q inductor element 100 (FIGS. 12–13) of the present invention will be fabricated. Techniques for deep etching of bulk silicon that can be employed in the formation of micro-electro-mechanical-system (MEMS) structures are described by Pandhumsoporn et al., in *High etch rate, deep anisotropic plasma etching of silicon for MEMS fabrication*, Part of SPIE Conference on Smart Electronics and MEMS, SPIE Vol. 3328 (1998), the disclosure of which is incorporated by reference herein.

Deep silicon etching may be conducted using the Alcatel deep plasma etching system, which uses inductively coupled plasmas (ICP) and fluorine-based non-corrosive chemistry. Vertical anisotropic deep plasma etching of silicon using ICP can be accomplished by two process regimes which use a fluorine-based chemistry. In the cryogenic, or low temperature process regime, the wafer temperature is in the range of −120° C. to −80° C. An ultra-thin layer of silicon dioxide (SiO$_2$) is formed as a sidewall passivating layer to control mask undercut. In the room temperature process regime, the wafer temperature is maintained in the range of −20° C. to 30° C. A thin fluoro-carbon polymer is formed as a sidewall passivating layer to control mask undercut. Under both process regimes, the Alcatel deep plasma etching system confers good process uniformity, high throughput, and good process reproducibility.

Using the Alcatel system, etching of bulk silicon has achieved an etch rate as high as 10 μm/min, a good profile control and a high throughput. An example of such a process used for etching at room temperature is the fabrication of the micro-fan like structure 20 of FIG. 1. A plurality of thin silicon walls 21, formed around an inner ring 15, which in turn defines a center cavity 17, have been etched to a depth of 200 μm with an etch rate of 10 μm/min for an almost vertical profile. If desired, the etching of the silicon walls 21 with the Alcatel inductively coupled plasma may be conducted without the etching of the silicon substrate 10 to form the center cavity 17. In that case, the silicon walls would extend radially from a center region (not shown) of bulk silicon.

Figure 2:
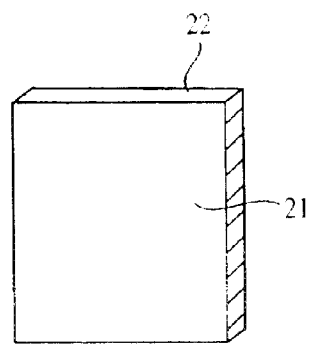
FIG. 2 is a three-dimensional view of a thin silicon wall of the micro-fan structure of FIG. 1.

FIG. 2 is a top view of the micro-fan like structure 20 of FIG. 1, in which ten thin silicon walls 21 are depicted. However, the number of such thin silicon walls can vary according to the device characteristics. A schematic view of a single thin silicon wall 21, including an upper surface 22, is represented in FIG. 2.

Figure 3:
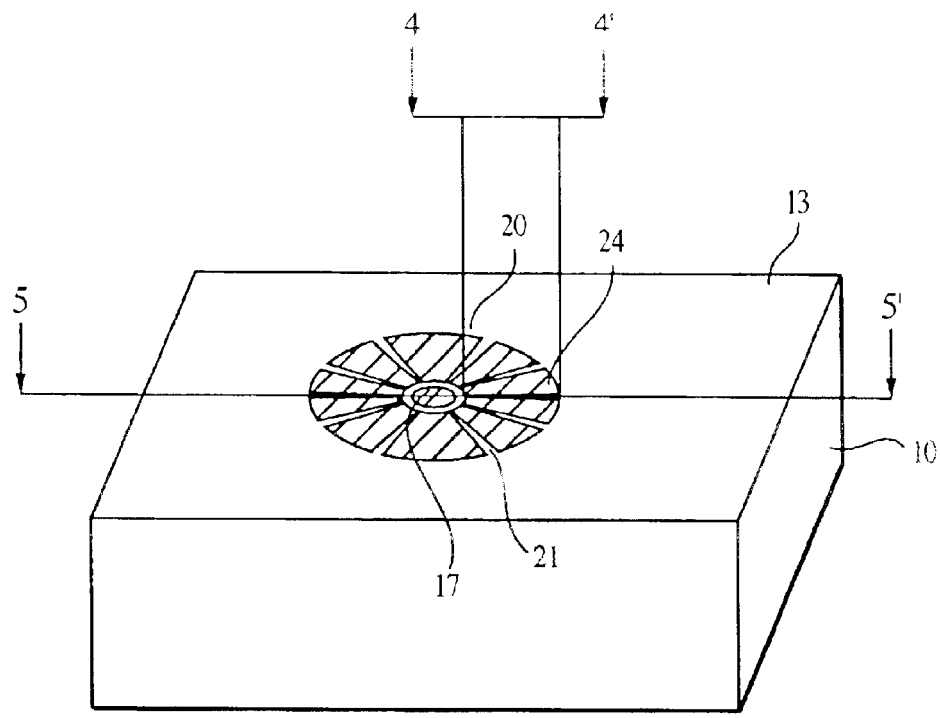
FIG. 3 is a three-dimensional view of the micro-fan structure of FIG. 1 at an intermediate stage of processing.

Reference is now made to FIG. 3. The space between the thin silicon walls 21 of the micro-fan like structure 20, as well as the center cavity 17, are filled with a filler resist 24, as illustrated in FIG. 3. The filler resist 24 may be formed of a material that provides a hard surface when exposed to high temperatures. For example, a photoresist material or a high temperature polymer, such as a photo-definable polyimide, which could undergo temperatures higher than 125° C. to provide a hard material, are among the preferred materials for the filler resist 24. However, other materials, such as conventional insulators, for example oxides and nitrides, may be used also. In addition, other organic and inorganic low dielectric constant materials, such as fluorinated silicon oxide (FSG), hydrogen silsesquioxane (HSQ), spin-on-polymers (SOP), Care, and benzocyclobutene (BCB), among others, may be used also.

In any event, the filler resist 24 may be formed in the cavity 11, between the thin silicon walls 21 and the silicon substrate 10, by deposition, for example spin coating at room temperature followed by curing at a predefined temperature, depending on the nature of the resist material. However, other known deposition methods, such as sputtering by chemical vapor deposition (CVD), plasma enhanced CVD (PECVD), or physical vapor deposition (PVD), may be used also.

After deposition of the filler resist 24, excess material from the filler resist 24, that is filler material that does not occupy the space defined by the center cavity 17 and the thin silicon walls 21 is removed by chemical mechanical polishing (CMP), for example, up to a planar upper surface 13 (FIG. 3) of the silicon substrate 10 and to the upper surface 22 of the thin silicon walls 21.

Figure 4:
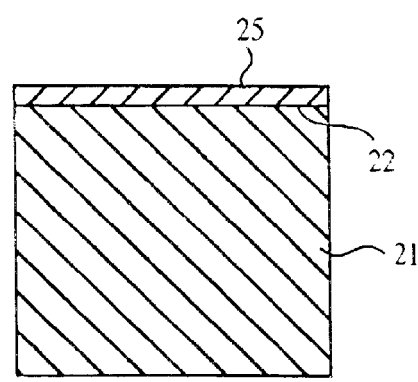
FIG. 4 is a cross-sectional view of the thin silicon wall of the micro-fan structure of FIG. 3, taken along line 4-4', at a subsequent stage of processing.

Next, as illustrated in FIG. 4, a thin oxide layer 25 of, for example, silicon oxide (SiO$_2$) is formed over each of the thin silicon walls 21 of the micro-fan like structure 20, as well as over the inner silicon ring 15. The thin oxide layer 25 is formed by deposition, for example by low-temperature plasma oxidation, to a thickness of about 100 Angstroms to 500 Angstroms. The thin oxide layer 25 may also be formed over the entire upper surface 13 of the silicon substrate 10 and then etched to remain only on the upper surfaces 22 of the thin silicon walls 21 and on the upper surface of the inner silicon ring 15. Alternatively, the thin oxide layer 25 may be left to cover the entirety of the upper surface 13 of the silicon substrate 10, depending on other processing steps which may be utilized to create other structures on the silicon substrate 10.

Figure 5:
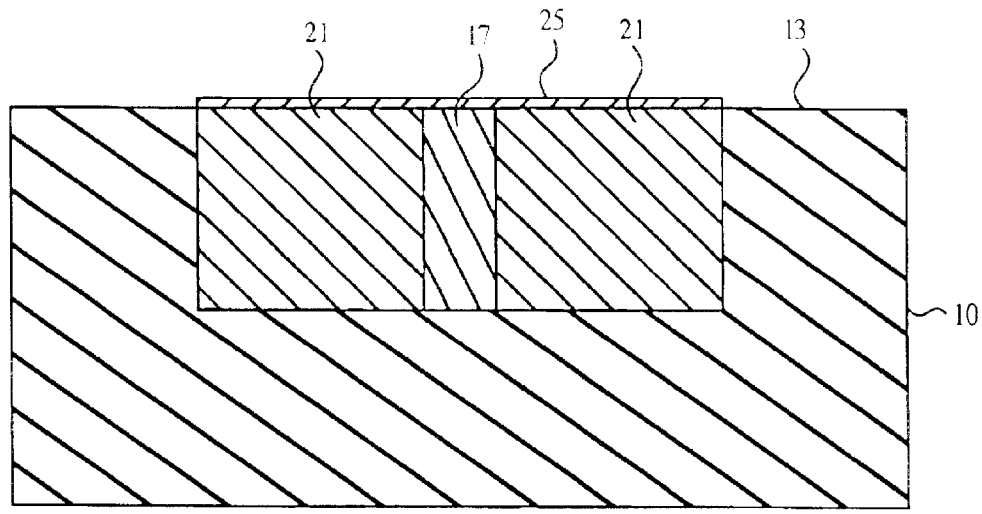
FIG. 5 is a cross-sectional view of the micro-fan structure of FIG. 3, taken along line 5-5', depicting the fabrication of a high Q inductor structure of the present invention.

Reference is now made to FIG. 5, which, for a better understanding of the invention, shows a cross sectional view of FIG. 3 taken along lines 5-5', illustrating the oxide layer 25 over the thin silicon walls 21.

Figure 6:
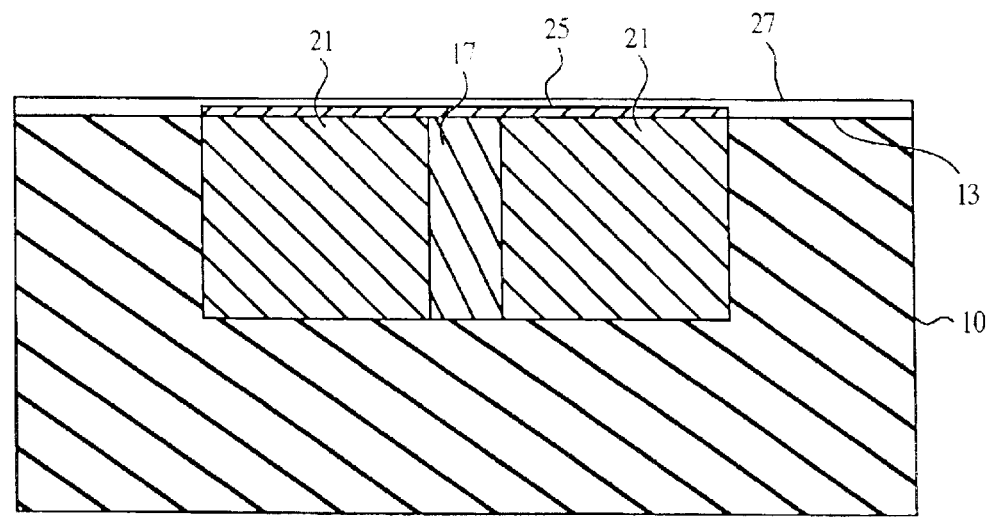
FIG. 6 is a cross-sectional view of the high Q inductor structure of FIG. 5 at a subsequent stage of processing.

Upon formation of the thin oxide layer 25, the inductive loops of the high Q inductor element 100 are formed. As explained in more detail below, a known IC technology for the fabrication of inductive loops involves optical lithography and deposition of high-conductivity metals, such as copper, with a fine pitch. The first step of this process, shown in FIG. 6, is the formation of a thick resist layer 27 over the upper surface 13 of the silicon substrate 10, including the thin oxide layer 25. The thick resist layer 27 is formed by spin coating, for example, to a thickness of about 1 to 1.5 μm. A UV mask (not shown) is placed over the thick resist layer 27, which has the conductor pattern therein for forming an inductive loop. The mask has areas which allow UV light to pass through and contact the thick resist layer 27. The UV light contacts the thick resist layer 27 and develops it so that, after etching, developed resist areas 29 and grooves 30 with a height of about 1 μm are left as shown in FIG. 7.

Figure 7:
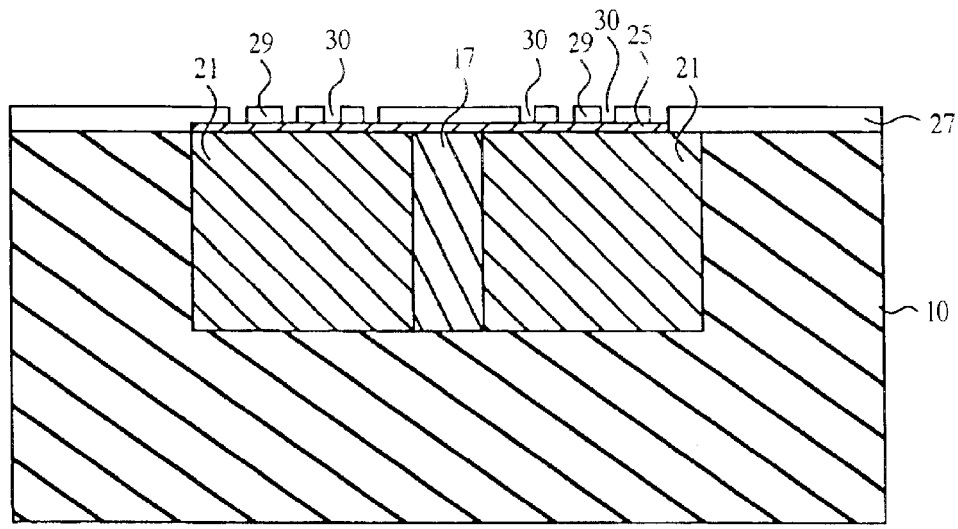
FIG. 7 is a cross-sectional view of the high Q inductor structure of FIG. 5 at a subsequent stage of processing.
Figure 8:
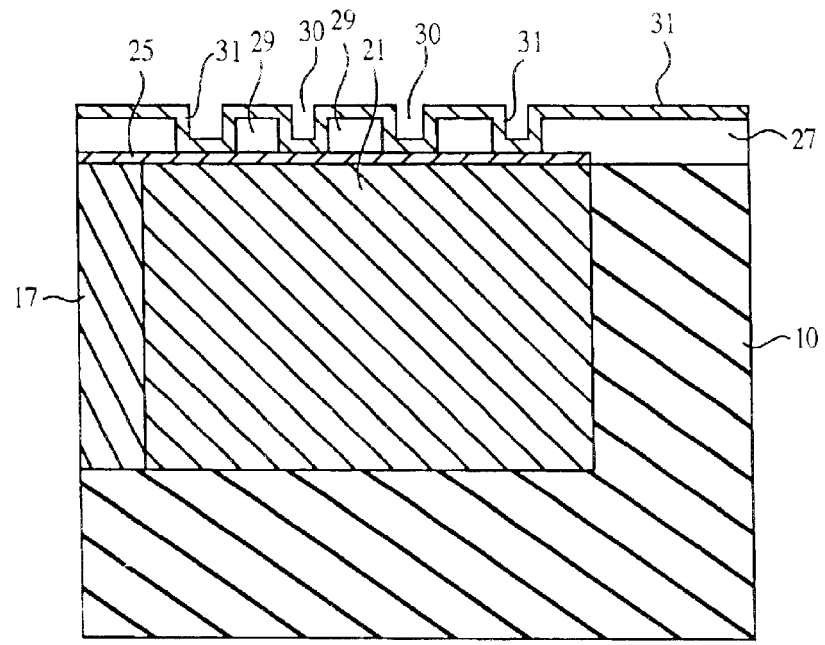
FIG. 8 is a cross-sectional lateral view of the high Q inductor structure of FIG. 5 at a subsequent stage of processing.

Reference is now made to FIG. 8, which, for simplicity, illustrates only the right portion of the structure of FIG. 7. A protective insulating layer 31 is first formed into the grooves 30 of the silicon substrate 10. The protective insulating layer 31 may be formed, for example, by evaporation or sputtering, to partially fill in the grooves 30, as shown in FIG. 8. For example, a thermal oxide of silicon, such as SiO or $SiO_2$, or a nitride, such as $Si_3N_4$, may be deposited by CVD or sputtering to a thickness of about 500 Angstroms to about 1000 Angstroms. Alternatively, a high temperature polymer film such as a polyimide may be employed.

Figure 9:
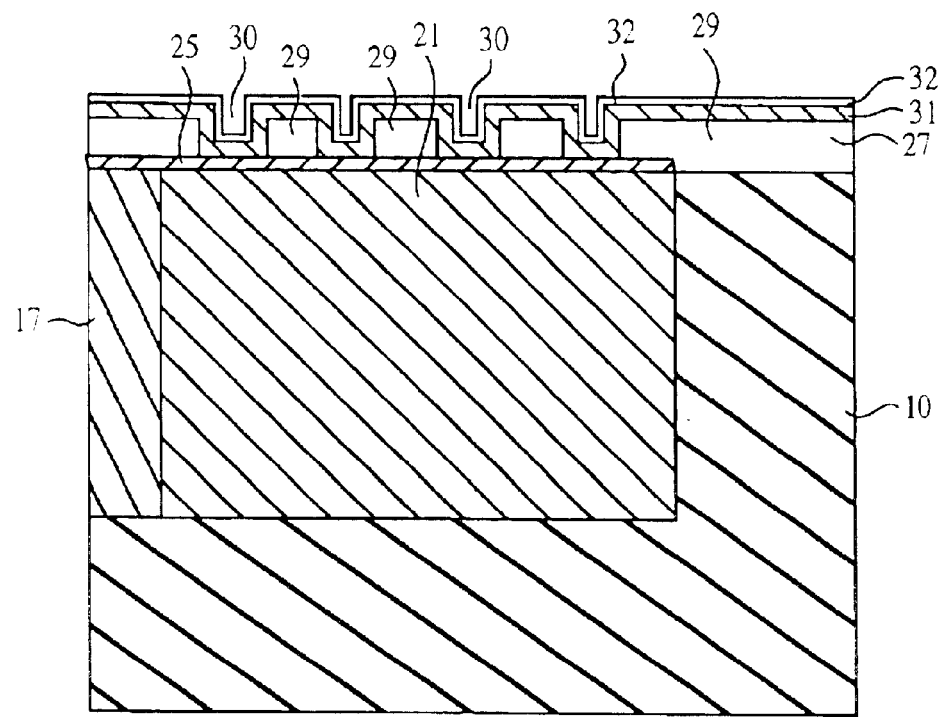
FIG. 9 is a cross-sectional lateral view of the high Q inductor structure of FIG. 5 at a subsequent stage of processing.

Following the deposition of the protective insulating layer 31, an adhesion/diffusion barrier layer 32 is next formed overlying the protective insulating layer 31, as shown in FIG. 9. The barrier layer 32 may comprise bonding materials such as titanium (Ti), titanium-tungsten (TiW), titanium nitride (TiN) or chromium, among others. The barrier layer 32 forms a strong mechanical and chemical bond between the conductive material which will be formed later and the underlying substrate to help prevent peeling of the formed conductive layer off the substrate. In a preferred embodiment of the invention, the barrier layer 32 is formed of graded titanium nitride (TiN). In this embodiment, titanium is deposited to a thickness of about 5 nm to about 10 nm, after which titanium nitride is deposited by continuing evaporation of titanium in the presence of nitrogen, for example.

Although the exemplary embodiments described below will include the protective insulating layer 31 and the barrier layer 32, the use of such insulating and barrier layers is optional, unless multilayer coils are built on the thin silicon walls 21 of the silicon substrate 10.

Figure 10:
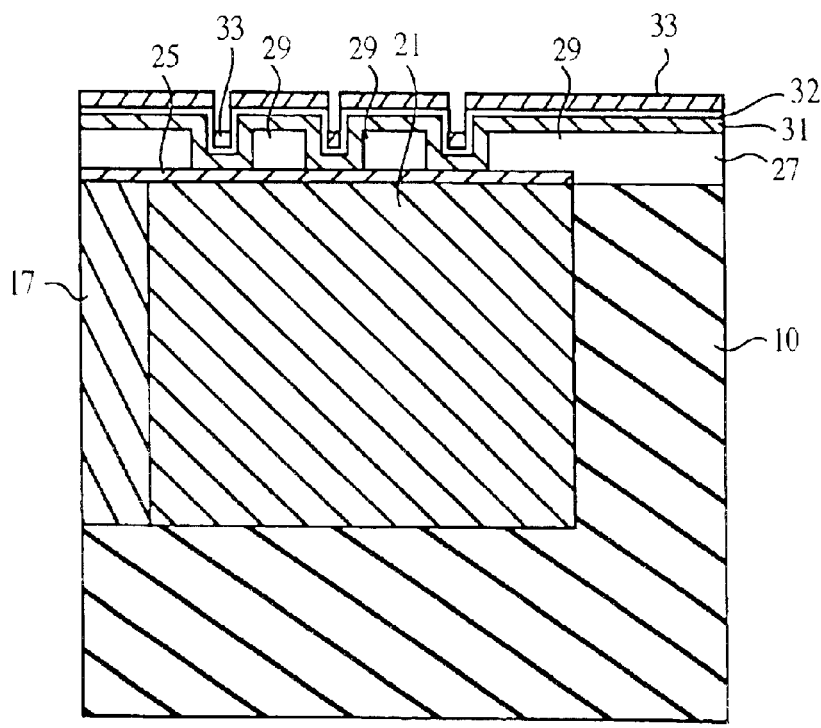
FIG. 10 is a cross-sectional lateral view of the high Q inductor structure of FIG. 5 at a subsequent stage of processing.

Next, as illustrated in FIG. 10, a conductive material layer 33 is formed over the silicon substrate 10 including the protective insulating layer 31 and the barrier layer 32, to fill in the grooves 30. In a preferred embodiment, the conductive material comprises copper (Cu) which has a much lower resistivity (1.67 μΩcm) than that of gold (2.35 μΩcm). However, other conductive materials and metals, such as aluminum, gold, or tungsten, among others, may be used also. Further, metal alloys may be employed also, depending on the characteristics of the IC device.

Figure 11:
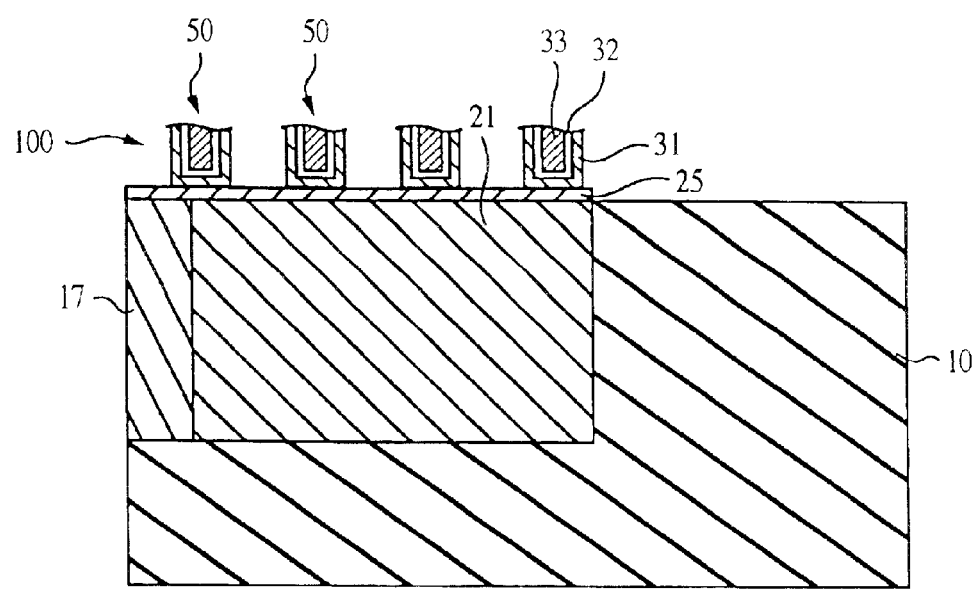
FIG. 11 is a cross-sectional lateral view of the high Q inductor structure of FIG. 5 at a subsequent stage of processing.

In a preferred embodiment of the invention, the conductive material is formed by a simple all-dry or lift-off process. As such, the conductive material 33, preferably comprising copper, is deposited by thermal evaporation into the grooves 30 to a thickness of about 0.3 μm to about 0.5 μm, and over the developed resist areas 29, also to a thickness of about 0.3 μ to about 0.5 μ, as illustrated in FIG. 10. The developed photoresist areas 29, as well as portions of the conductive material layer 33, the barrier layer 32 and the insulating layer 31 formed on top of the photoresist areas 29, are then removed or lifted off, by using a solvent, such as acetone for example, to obtain inductive loops 50 of the high Q inductor element 100, as shown in FIG. 11.

Although the preferred method for forming the inductive loops 50 is the lift-off technique, the invention is not limited to the preferred embodiment. Accordingly, the conductive material layer 33 could be formed by other techniques, such as blanket deposition by a known CVD, PVD, or a combination of these techniques, followed by chemical mechanical polishing (CMP). However, these techniques require more processing steps and, thus, are less desirable.

Figure 12:
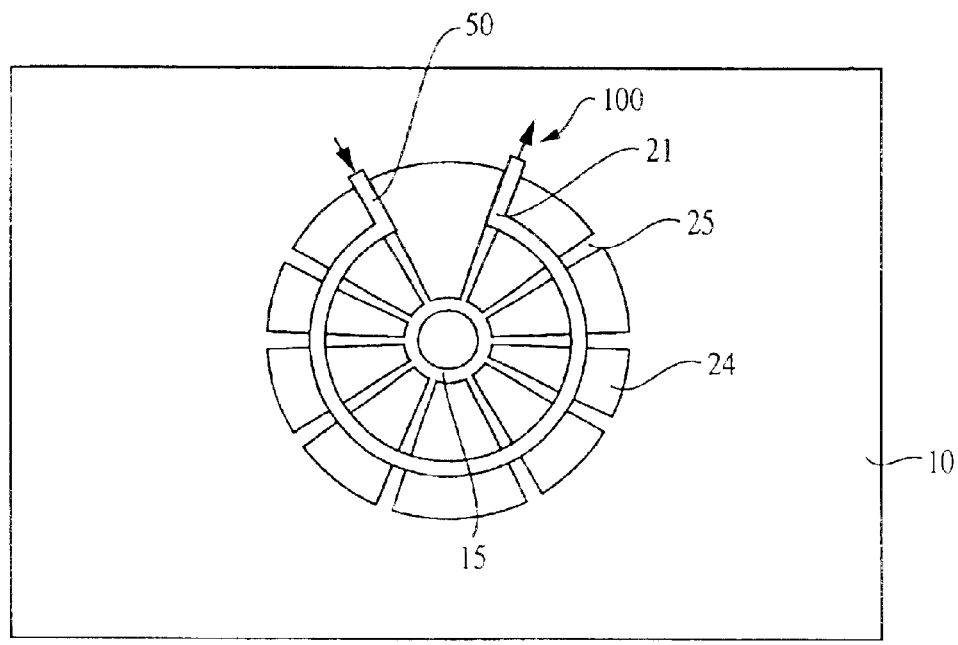
FIG. 12 is a top view of the high Q inductor structure of FIG. 11 depicting one single loop.

A top view of a single inductive loop 50 is represented in FIG. 12. The inductive loop 50 is formed over the thin silicon oxide walls 21 covered with the thin oxide layer 25 of the micro-fan like structure 20. However, a plurality of planar inductive loops and/or a spiral inductor (not shown in FIG. 12) may be also formed, as desired. In any event, each inductive loop 50 of the high Q inductor element 100 comprises portions of the insulating layer 31, the barrier layer 32 and the conductive material 33. If copper is used as the conductive material 33, the exposed copper surface of the inductive loop 50 may be also passivated, for example by exposing the silicon substrate 10 to a dilute silane at approximately 300° C. to form a thin silicide layer (not shown) on the exposed copper surface. Alternatively, gold (Au) could be employed over the exposed copper surfaces, to skip the copper silicidation step. As such, gold can be added toward the end of the copper deposition step, to form a thin gold layer to a thickness of about 100 nm to about 200 nm overlying the copper layer.

In any event, the inductive loops 50 present the advantage of not being encased in a high dielectric constant insulator, as conventional inductive elements are. In a preferred embodiment, the filler resist 24 is removed by immersion in a solvent, for example, subsequent to the formation of the inductive loops 50. The removal of the filler resist 24, which has a dielectric constant in the range of about 3.0 to about 3.5, allows air, which has a dielectric constant of 1.0, to surround the thin silicon walls 21 as well as the inductive loops 50 that they support. This way, the inductive loops 50 are for the most part suspended in air, forming, therefore, an air bridge like structure. The reduction in the dielectric constants of the materials surrounding the thin silicon walls 21 which support the inductive loops 50 confers reduced parasitic capacitance between the inductive loops 50. This, in turn, minimizes the capacitive coupling to the silicon substrate 10. The losses in the inductive loops 50 are also minimized by using high conductivity copper. Another advantage is that the thin silicon walls 21 support the weight of the inductive loops 50 and make them more mechanically stable. This aspect of the invention is particularly important to IC applications in mobile devices.

The combination of thin silicon walls 21 along with the etched out space around them further confers lower values of capacitive coupling to the silicon substrate 10. Thus, losses in the silicon substrate are minimized without using very complex and large numbers of insulators and metals to remove the conductive material far away from the substrate. In addition, the decrease in losses due to capacitive coupling to the conductive silicon substrate increases the quality factor Q, which is dependent on such losses. Further, having a high Q, the inductor element 100 is capable of operating at high self-resonance frequency (the frequency at which the loop ceases to be an inductive element and becomes a capacitive one). The demand for high self resonance frequency requires minimizing the capacitance between the loops 50 of the high Q inductor element 100. This, again, is accomplished by employing an air bridge like structure, such as the micro-fan like structure 20 for supporting the high Q inductor element 100, which is not encased in a high dielectric constant insulator.

Figure 13:
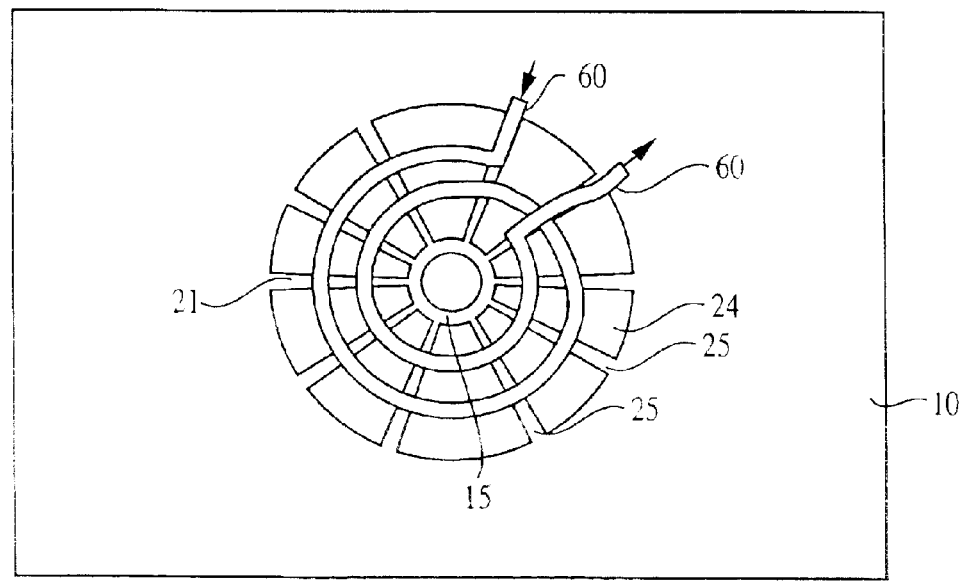
FIG. 13 is a top view of a high Q inductor structure having a spiral loop.
Figure 14:
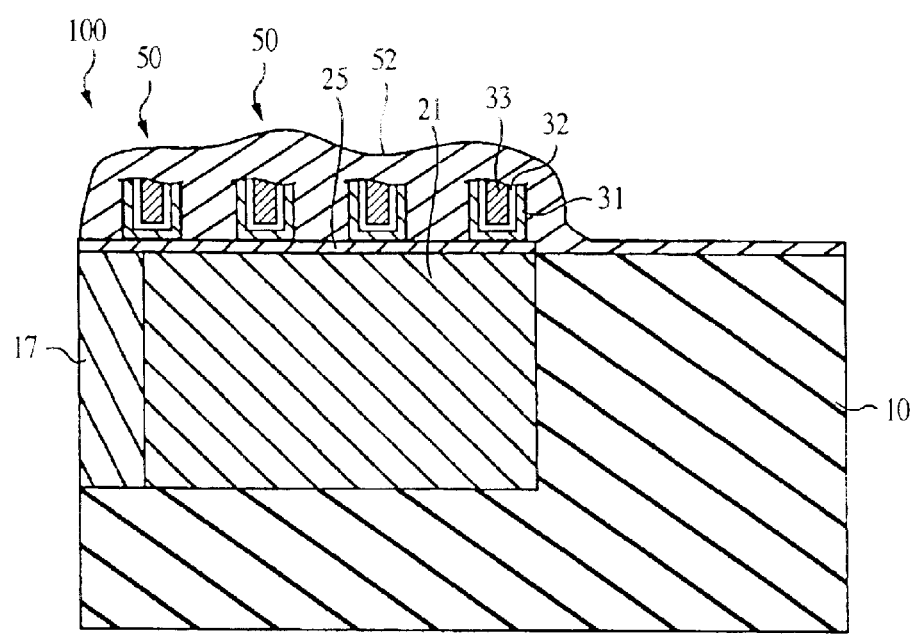
FIG. 14 is a cross-sectional lateral view of the high Q inductor structure of FIG. 5 at a stage of processing subsequent to that shown in FIG. 11.

Although only one inductive loop 50 is shown in FIG. 12, it must be readily apparent to those skilled in the art that in fact any number of such inductive loops 50 may be formed on the micro-fan like structure 20 of the silicon substrate 10. Further, a spiral inductive element may be formed also, as desired, and thus the invention is not limited to single or planar loops. An exemplary embodiment of a spiral inductive element 60 is illustrated in FIG. 13. Either way, the invention provides an inductive element with a high inductance value (L) that occupies a small silicon area.

Additional steps to create an electromagnetic IC device may be carried out. Thus, additional insulating layers, such as insulating layer 52 of FIG. 14, may be formed to complete the fabrication of the high Q inductor element 100. The insulating layer 52 may cover only the inductive loops 50, or may extend over the silicon substrate 10, as desired.

Figure 15:
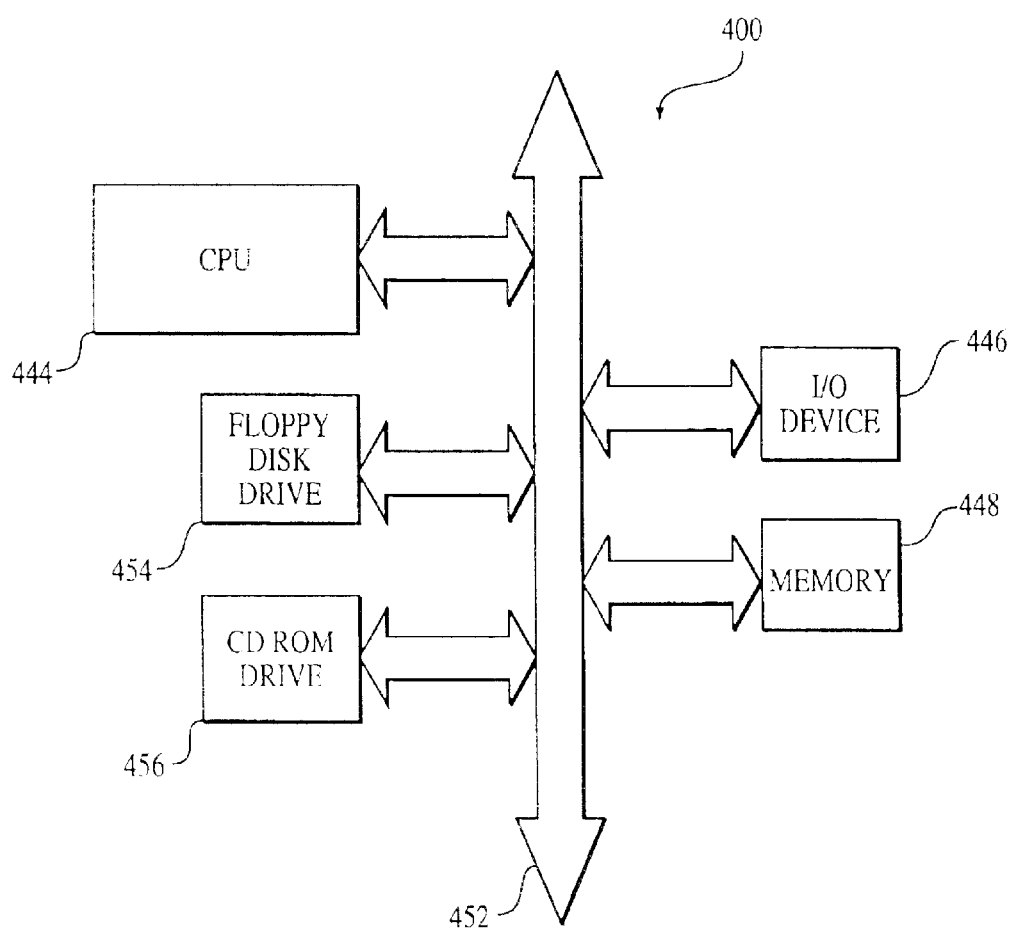
FIG. 15 is a schematic diagram of a processor system incorporating a high Q inductor structure of the present invention.

A typical processor based system 400 which includes a memory circuit 448, for example a DRAM, containing high Q inductor elements according to the present invention is illustrated in FIG. 15. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which.includes one or more high Q inductor elements 100. If desired, the memory 448 may be combined with the processor, for example CPU 444, in a single integrated circuit.

Although the exemplary embodiments described above refer to one high Q inductor element, it is to be understood that the present invention contemplates the use of a plurality of high Q inductor elements. Also, although the exemplary embodiments described above refer to a structure with ten thin silicon walls, it must be understood that the present invention contemplates the use of other numbers of thin silicon walls. Further, the invention is not limited to a micro-fan structure formed within a silicon substrate with <100> crystallographic orientation. Rather, the present invention applies to micro-fan structures etched by a high-density or inductively coupled plasma in a substrate of any suitable orientation. Thus, the thin walls or support elements which support the high Q inductor element of the invention may be etched to form another angle with the substrate, and not only a 90° angle. Thus, the grooves formed by such thin support elements are not limited to cylindrical grooves, and may include V-shaped grooves as well. This, of course, will change the angle between such support elements and the planar surface of the high Q inductor element.

In addition, the thin walls or support elements that support the high Q inductor element of the invention, such as the thin silicon walls 21 of FIG. 1, may not extend all the way through the cavity 11, to reach its bottom. Instead, the height of the thin silicon walls 21 may be less than that of the cavity 11, so that a true air bridge structure may be formed. Although the present invention has been illustrated with reference to thin silicon walls that support the inductive element of the invention, it must be understood that the invention is not limited to silicon walls, or semiconductor walls. Thus, other supporting structures, such as columns, bridges, arches or piers, etched in a semiconductor substrate, may be used also, as long as they provide support for the inductive elements to be formed later.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An inductive element comprising:
   a semiconductor substrate including a cavity and having at least one semiconductor wall formed within said cavity, said semiconductor wall including a top surface;
   an oxide insulating layer provided on said top surface; and
   a conductive element located over said oxide insulating layer, said conductive element being supported by said semiconductor wall and including at least one loop.

2. The inductive element of claim 1, wherein said semiconductor substrate has a plurality of semiconductor walls.

3. The inductive element of claim 2, wherein said substrate has a center portion, and said semiconductor walls extend radially from said center portion.

4. The inductive element of claim 1, wherein said semiconductor wall includes silicon.

5. The inductive element of claim 1, wherein said semiconductor wall has a height of about 200 microns.

6. The inductive element of claim 1, wherein said oxide insulating layer has a thickness of about 100 Angstroms to about 500 Angstroms.

7. The inductive element of claim 1, further comprising a resist material formed between said at least one semiconductor wall and said semiconductor substrate.

8. The inductive element of claim 1, wherein said loop has a thickness of about 0.3 microns to about 0.5 microns.

9. The inductive element of claim 1, wherein said loop includes copper.

10. The inductive element of claim 1, wherein said loop has a spiral configuration.

11. The inductive element of claim 1, further comprising a barrier layer over said oxide insulating layer, said barrier layer is formed of a material selected from the group consisting of titanium, titanium nitride, titanium tungsten, titanium nitride and chromium.

12. The inductive element of claim 1, wherein said semiconductor substrate is one of a silicon substrate, a germanium substrate and a gallium arsenide substrate.

13. The semiconductor device having a substrate and a cavity structure, a portion of said substrate being contact with said cavity, said device comprising:
   a plurality of semiconductor support element provided in said cavity, said plurality of semiconductor support element extending radially from a center portion of said cavity structure and having a height of about 200 microns, said plurality of semiconductor support elements including a top surface;

an insulating layer provided on said top surface;

a barrier layer provided over said insulating layer; and at least one electrically conductive loop formed over said barrier layer, said electrically conductive loop being supported by said semiconductor support elements.

14. The device of claim 13, wherein said semiconductor support elements form an angle with said electrically conductive loop.

15. The device of claim 14, wherein said angle is a 90° angle.

16. The device of claim 13, further comprising a resist material formed in said cavity structure, between said semiconductor support element and said substrate.

17. The device of claim 13, wherein said electrically conductive loop has a thickness of about 0.3 microns to about 0.5 microns.

18. The device of claim 13, wherein said electrically conductive loop has a spiral configuration.

19. The device of claim 13, further comprising a top insulating layer over said electrically conductive loop.

20. The device of claim 13, wherein said semiconductor support elements have a wall configuration.

21. The device of claim 13, wherein said semiconductor support elements have column configuration.

22. An inductive element comprising:

a semiconductor substrate including a cavity and having a plurality of semiconductor walls formed in said cavity, said semiconductor walls including silicon and extending radially from a center portion of said semiconductor substrate;

a silicon oxide layer provided on top surfaces of said semiconductor walls; and at least one spiral loop located over said silicon oxide layer, said at least one spiral loop being supported by said semiconductor walls and having a thickness of about 0.3 microns to about 0.5 microns.

23. The inductive element of claim 22, wherein said semiconductor walls have a height of about 200 microns.

24. The inductive element of claim 22 further comprising a barrier layer over said silicon oxide layer, said barrier layer being formed of a material selected from the group consisting of titanium, titanium nitride, titanium tungsten, titanium nitride and chromium.

25. The inductive element of claim 22, wherein said semiconductor substrate is one of a silicon substrate, a germanium substrate and a gallium arsenide substrate.

26. An inductive element comprising:

a semiconductor substrate including a cavity and having a plurality of semiconductor columns formed in said cavity, said semiconductor columns including silicon and extending radially from a center portion of said semiconductor substrate;

a silicon oxide layer provided on top surfaces of said semiconductor columns; and at least one spiral loop located over said silicon oxide layer, said at least one spiral loop being supported by said semiconductor walls and having a thickness of about 0.3 microns to about 0.5 microns.

27. The inductive element of claim 26, wherein said semiconductor columns have a height of about 200 microns.

28. The inductive element of claim 26, further comprising a barrier layer over said silicon oxide layer, said barrier layer being formed of a material selected from the group consisting of titanium, titanium nitride, titanium tungsten, titanium nitride and chromium.

29. The inductive element of claim 26, wherein said semiconductor substrate is one of a silicon substrate, a germanium substrate and a gallium arsenide substrate.

* * * * *

UNITED STATES PATENT AND TRADEMARK OFFICE
CERTIFICATE OF CORRECTION

PATENT NO. : 6,806,805 B2
DATED : October 19, 2004
INVENTOR(S) : Kie Y. Ahn et al.

It is certified that error appears in the above-identified patent and that said Letters Patent is hereby corrected as shown below:

Column 1,
Line 27, change "minituarization" to -- miniaturization --;

Column 3,
Line 20, change ""metal"0" to -- "metal" --;

Column 4,
Line 33, change "Care" to -- flare --; and

Column 8,
Line 64, "being contact" to -- being in contact --.

Signed and Sealed this

Twenty-second Day of February, 2005

JON W. DUDAS
*Director of the United States Patent and Trademark Office*